(12) United States Patent
Wong et al.

(10) Patent No.: US 8,279,611 B2
(45) Date of Patent: Oct. 2, 2012

(54) FLEXIBLE CABLE HAVING RECTANGULAR WAVEGUIDE FORMED THEREIN AND METHODS OF MANUFACTURING SAME

(75) Inventors: Joshua Kwan Ho Wong, Waterloo (CA); Ying Tong Man, Waterloo (CA); Yihong Qi, Waterloo (CA); Perry Jarmuszewski, Waterloo (CA); Antonio Chan, Waterloo (CA)

(73) Assignee: Research In Motion Limited, Waterloo (CA)

( * ) Notice: Subject to any disclaimer, the term of this patent is extended or adjusted under 35 U.S.C. 154(b) by 218 days.

(21) Appl. No.: 12/634,064

(22) Filed: Dec. 9, 2009

(65) Prior Publication Data

US 2011/0132641 A1 Jun. 9, 2011

(51) Int. Cl.
*H05K 1/00* (2006.01)
(52) U.S. Cl. ...................................... 361/749
(58) Field of Classification Search .............. 361/749, 361/818, 820, 761, 764; 174/58; 257/728
See application file for complete search history.

(56) References Cited

U.S. PATENT DOCUMENTS

| | | | |
|---|---|---|---|
| 2,812,501 A | 11/1957 | Sommers | |
| 4,845,311 A | 7/1989 | Schreiber et al. | |
| 5,300,899 A | 4/1994 | Suski | |
| 6,687,518 B1 | 2/2004 | Park | |
| 7,088,294 B2 | 8/2006 | Qi et al. | |
| 7,316,509 B2 * | 1/2008 | Posamentier | 385/88 |
| 7,405,703 B2 | 7/2008 | Qi et al. | |
| 2001/0008839 A1 | 7/2001 | Cho | |
| 2004/0027296 A1 | 2/2004 | Gerber | |
| 2004/0041663 A1 | 3/2004 | Uchimura et al. | |
| 2004/0219958 A1 | 11/2004 | Chenoweth et al. | |
| 2008/0124982 A1 | 5/2008 | Kim | |
| 2008/0287171 A1 | 11/2008 | Qi et al. | |
| 2009/0061967 A1 | 3/2009 | Matsuda | |
| 2009/0085696 A1 | 4/2009 | Abdul-Gaffoor et al. | |
| 2009/0173533 A1 | 7/2009 | Brock et al. | |

FOREIGN PATENT DOCUMENTS

| | | |
|---|---|---|
| DE | 22 46 730 | 4/1974 |
| DE | 2246730 | 4/1974 |
| DE | 44 02 082 | 8/1994 |
| DE | 4402082 | 8/1994 |
| DE | 20205941 | 7/2002 |
| DE | 20 2007 002281 | 4/2007 |
| EP | 1 551 154 | 7/2005 |
| EP | 1 612 953 | 1/2006 |

(Continued)

OTHER PUBLICATIONS

Partial European Search Report dated May 3, 2010.
European Search Report dated May 3, 2010.
Anonymous: "Flexible Strip Transmission Line. Apr. 1960". IBM Technical Disclosure Bulletin, vol. 2, No. 6, Apr. 1, 1960, pp. 35-36, XP002575710, New York, US.

(Continued)

*Primary Examiner* — Jeremy Norris
*Assistant Examiner* — Tremesha S Willis
(74) *Attorney, Agent, or Firm* — Ridout & Maybee LLP (57) ABSTRACT

A flexible cable for carrying RF signals and method of manufacturing same. The cable includes an elongate base substrate including a dielectric layer with an upper metal layer deposited on one side and a lower metal layer deposited on its other side. It further includes two parallel spaced-apart series of vias formed along the length of the base substrate, each via electrically interconnecting the upper metal layer and the lower metal layer, whereby a rectangular cross-sectional waveguide is provided between the upper metal layer, the lower metal layer and the two series of vias.

19 Claims, 8 Drawing Sheets

FOREIGN PATENT DOCUMENTS

| | | |
|---|---|---|
| JP | 2007 036515 | 2/2007 |
| KR | 20060135359 | 12/2006 |
| WO | WO03/077366 | 9/2003 |
| WO | WO2005/112405 | 11/2005 |
| WO | WO2007/136040 | 11/2007 |

OTHER PUBLICATIONS

European Search Report dated Apr. 6, 2010.

International Search Report dated Feb. 16, 2011.

Aftanasar et al, "Fabrication of Dielectric-Filled Rectangular Waveguide using Thick-Film Processing", High Frequency Postgraduate Student Colloquium, 2001 6th IEEE, Sep. 10, 2001, pp. 82-87, ISBN: 0-7803-7118-6.

International Search Report dated Feb. 16, 2011—PCT/CA2010/001933.

* cited by examiner

FLEXIBLE CABLE HAVING RECTANGULAR WAVEGUIDE FORMED THEREIN AND METHODS OF MANUFACTURING SAME

FIELD

The present application generally relates to RF communications and cables for transmitting RF signals and, in particular, to a flexible cable capable of transmitting RF signals and methods of manufacturing such cable.

BACKGROUND

As consumer electronics devices become more compact and achieve greater functionality, it has become increasingly difficult to arrange the interior components to realize higher density. This is especially so with wireless communications devices, including handheld devices, personal digital assistants, mobile smartphones, etc., where the devices are increasingly compact, yet include a greater number of components and features than ever before. Many such devices now include keyboards, cameras, trackballs, display screens (ordinary or touchscreen), memory cards, speakers, microphones, I/O jacks, and multiple antennas, for cellular, IEEE 802.11, Bluetooth®, GPS, and other radio frequency communications. This has made the configuration of the components challenging and puts circuit board space at a premium.

The shrinking size of mobile communication devices and the inclusion of multiple RF antennas within the devices lead to difficulty with issues of interference and isolation. In order to improve isolation and minimize interference, some mobile communication devices will locate antennas at opposite ends of the device so as to try to maximize the physical distance between the two antennas. This technique is limited by the size of the device and by the fact that the antennas are typically connected to common circuitry or ground planes, which can lead to problems in achieving adequate isolation between the antennas. The need to place antennas in different parts of the device can lead to situations in which RF signals need to be transmitted from one portion of the device to another.

In a two-piece device, such as a slider or flip-phone, a flex cable is often used to send signals between two different pieces of the device. Existing flex cables are typically designed to support transmission of low frequency or digital signals and are too lousy and noisy for use in transmitting RF-level signals.

It would advantageous to provide for a flexible cable capable of transporting RF-level signals.

BRIEF DESCRIPTION OF THE DRAWINGS

Reference will now be made, by way of example, to the accompanying drawings which show example embodiments of the present application, and in which.

Similar reference numerals may have been used in different figures to denote similar components.

DESCRIPTION OF EXAMPLE EMBODIMENTS

In one aspect, the present application discloses flexible cable for communicating RF signals. The cable includes an elongate base substrate including a dielectric layer with an upper metal layer deposited on one side and a lower metal layer deposited on its other side; and two parallel spaced-apart series of vias formed along the length of the base substrate, each via electrically interconnecting the upper metal layer and the lower metal layer, whereby a rectangular cross-sectional waveguide is provided between the upper metal layer, the lower metal layer and the two series of vias.

In another aspect, the present application discloses a method of manufacturing a flexible cable. The method includes providing an elongate base substrate including a dielectric layer with an upper metal layer deposited on one side and a lower metal layer deposited on its other side; and forming two parallel spaced-apart series of vias along the length of the base substrate, each via electrically interconnecting the upper metal layer and the lower metal layer, whereby a rectangular cross-sectional waveguide is provided between the upper metal layer, the lower metal layer and the two series of vias.

Current mobile communication devices come in a number of form factors. For example, many devices adopt a "candy bar" form factor in which the device has a single rigid casing in which all components are housed. Other mobile communication devices use two-piece form factors, such as "flip-phones" and "sliders" and "swivel phones". A flip-phone is a two-piece device in which the two pieces are interconnected by a pivoting mechanism. A base portion of the flip-phone is connected to a second portion of the flip-phone by way of a hinge. In a closed position, the second portion substantially overlays the base portion. In a slider phone, the base portion and second portion (or "slider portion") are connected together by way of a sliding mechanism that allows the slider portion to move relative to the base portion between a closed position, in which the slider portion substantially overlaps the base portion, and an extended position, in which the slider portion is parallel to but substantially offset from the base portion. The sliding mechanism often includes grooves, tracks or rails linking the two portions and permitting the slider portion to move linearly into its extended position.

To the extent that the present application describes or relates to slider phones, the present application is not limited to any particular slider mechanism or method of interconnecting a base portion and slider portion. In some cases, the present application may be applicable to other two-piece form factors, including flip-phones and swivel phones, as will be understood by those of ordinary skill in the art after reviewing the following disclosure.

Mobile communication devices that employ a two-piece form factor, such as a slider phone, a flip phone, or swivel phone, typically need a way of communicating data between the base portion and the second (e.g. slider) portion. For example, the base portion may include the processor, memory, and various other components, whereas the second portion may include the display or keypad or other components of the phone. In many devices, multiple data lines are used to communicate data between components in the second portion and components in the base portion. Because the second portion moves relative to the base portion, flexible communication lines are used to interconnect the components and circuitry (if any) in the second portion with the circuitry in the base portion. For these purposes, many devices employ a flex cable.

Figure 1:
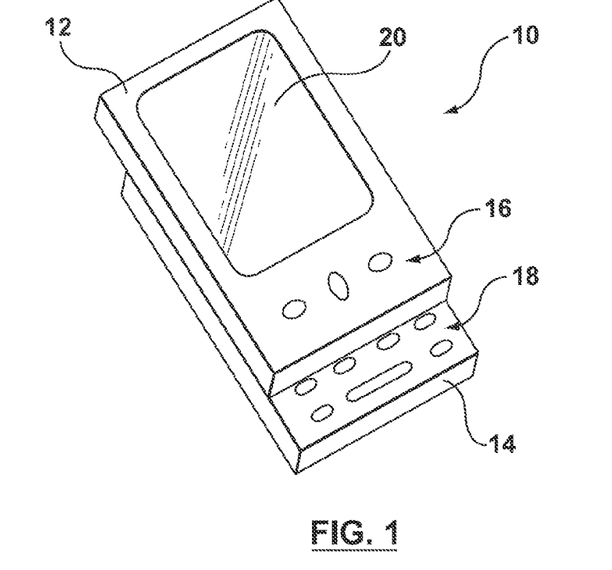
FIG. 1 diagrammatically shows an example of a mobile communication device.

Reference is now made to FIG. 1, which diagrammatically shows an example mobile communication device 10. The mobile communication device 10 in this example is configured as a slider phone having a base portion 14 and a slider portion 12, although it will be appreciated that the present application is applicable to two-piece form factors more generally. The slider portion 12 includes a display 20 and buttons or user navigation features 16. The base portion 14 includes a keypad or keyboard 18. When in a closed position, in which the base portion 14 and slider portion 12 substantially overlap, the keyboard 18 is not accessible. When the slider portion 12 is pulled into the extended position, the keyboard 18 becomes accessible and usable.

Although in this example the features of the slider portion 12 are visible when the device 10 is in a closed position and the features of the base portion 14 are inaccessible when the device 10 is in the closed position, in other examples the features of the base portion 14 may be visible when the device 10 is in the closed position and the features of the slider portion 12 may be inaccessible when the device 10 is a closed position. In such an embodiment, the slider portion 12 may be "underneath" the base portion 14, and is pulled out to make it accessible.

Figure 2:
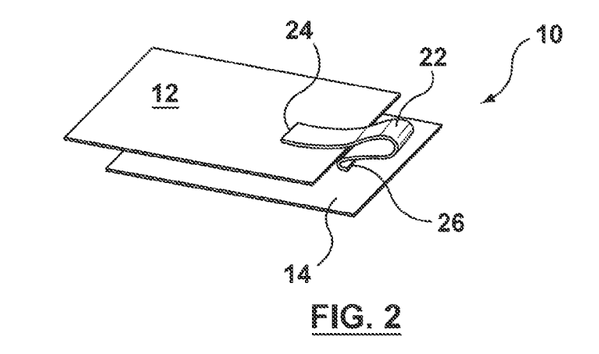
FIGS. 2 and 3 diagrammatically illustrate a slider-type mobile communications device in partly closed and fully extended positions, respectively.
Figure 3:
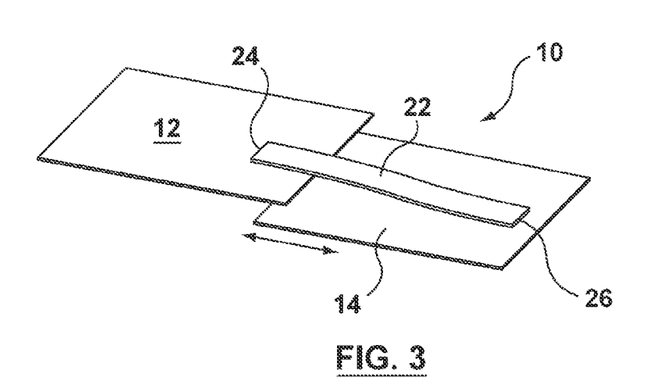

Reference is now made to FIGS. 2 and 3, which diagrammatically illustrate the slider-type mobile communications device 10 in partly closed and fully extended positions, respectively. The base portion 14 and slider portion 12 are electrically interconnected by way of a flex cable 22. The flex cable 22 permits data communication between components within the base portion 14 and the slider portion 12.

The flex cable 22 is structured such that it is capable of folding upon itself, which permits the slider portion 12 and base portion 14 to move relative to each other even while interconnected by the flex cable 22. As will be see in FIG. 2, when the slider portion 12 and base portion 14 substantially overlap, the flex cable 22 folds over upon itself as its end points or connection points (labeled 24 and 26) are brought closer together. When the slider portion 12 is moved linearly into the extended position, as illustrated in FIG. 3, the connection points 24, 26 are drawn apart from one another, pulling the flex cable 22 into a substantially flat or extended position.

The flex cable 22 is visible in FIGS. 2 and 3 for ease of illustration. It will be appreciated that typical mobile communication devices will not have an exposed flex cable; rather, the flex cable will be generally housed within the structure of the slider portion 12, base portion 14, or slider mechanism connecting the two. In general, the device 10 is structured so as to provide sufficient space within its casing(s) for the folding and extension of the flex cable 22. Due to the limited volume available in a typical device, the flex cable is usually a single layer flex and the folding action of the flex is limited spatially in the x direction.

Existing slider phones typically house all RF-related components within the base portion 14. The RF-related components include RF antennas, such as for Bluetooth®, WiFi, cellular, GPS, or other such communications, and their corresponding transceivers. A typical transceiver generates RF-level signals for driving the antenna during transmissions, and receives RF signals induced in the antenna during reception. The received analog RF signals may be filtered, conditioned, or otherwise shaped, before being sampled and digitized. The digitized signal is then stored in memory or supplied to other digital components within the device 10, such as a processor, which may include a digital signal processor or a microprocessor or any other such digital processing element.

The antennas used in the device 10 may have any of a number of different configurations, depending on the specific frequency and application for which they are intended. Example antennas may be monopole, dipole, inverted-F, patch, microstrip, slot antennas, chip antennas, or any of a variety of other types. In some cases, multiple antenna configurations are combined to realize a particular antennas, such as, for example, a folded meander-line inverted-F antenna, or a patch antenna with slots and parasitic elements. The range of possible antenna configurations will be understood by those of ordinary skill in the art.

In some cases, the device 10 may include a diversity antenna. In the context of the present application, the term "diversity antenna" refers to two antennas placed a distance apart to achieve spatial/polarization/pattern diversity. In some cases, one antenna is intended for transmission and the other for reception (transmit/receive diversity). In other cases, the two antennas may both be intended for reception, transmission, or both (spatial/polarization/pattern diversity). In the latter case, the device 10 may select one of the antennas for transmitting or receiving a particular signal based upon a comparison of measurements such as signal-to-noise ratio (SNR). As the device 10 changes position, one of the antennas may be exposed to a stronger signal and the device 10 may begin to use it instead. In yet another embodiment, the signals received by the two antennas may be jointly used to improve the quality of the reconstructed received signal (for example, a time-domain convolution of the two signals together to improve the signal-to-noise ratio).

Figure 4:
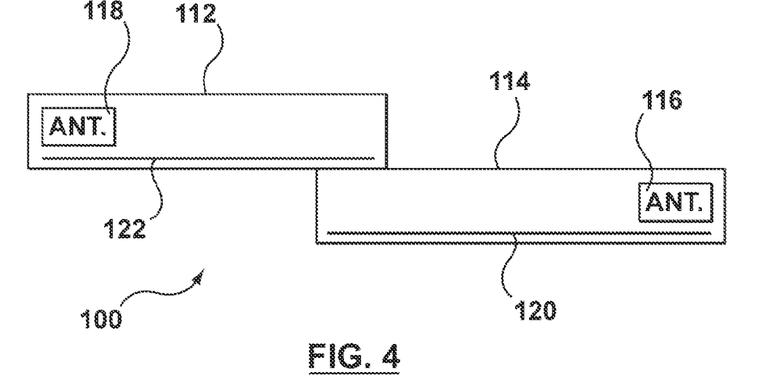
FIG. 4 shows a simplified block diagram of an example embodiment of a slider-type mobile communications device.

Reference is now made to FIG. 4, which shows a simplified block diagram of an example embodiment of a slider-type mobile communications device 100. The device 100 includes a base portion 114 and a slider portion 112. The base portion 114 and slider portion 112 are mechanically connected though a slider mechanism (not illustrated), which permits the slider portion 112 to slide between a closed position and an extended position.

The device 100 includes a first antenna 116 located in the base portion 114, and a second antenna 118 located in the slider portion 112. It will be understood that the base portion 114 further includes a processor, memory and other circuitry and components not specifically illustrated in FIG. 4. In particular, the base portion 114 includes a transceiver (not shown) for the first antenna 116.

The transceiver (not shown) for the second antenna 118 may, in some embodiments, be located within the slider portion 112. In other embodiments, the transceiver for the second antenna 118 may be located in the base portion 114.

In this particular embodiment, the first antenna 116 is located proximate to an end of the base portion 114 furthest from the slider portion 112 when in its extended position, and the second antenna 118 is located in proximate to an end of the slider portion 112 furthest from the base portion 114 when in the extended position. In this configuration, the antennas 116, 118 are able to achieve a large spatial separation when the device 100 is in the extended position. Moreover, the antennas 116, 118 may experience fewer attenuation and interference problems when in these locations.

Referring still to FIG. 4, the base portion 114 includes a base ground plane 120. The operation and radiation pattern of first antenna 116 is influenced by the base ground plane 120. This is especially true in low frequency operation where the device chassis becomes part of the radiating element.

The slider portion 112 includes a slider ground plane 122. The slider ground plane 122 impacts the operation and radiation pattern of the second antenna 118. In the present embodiment, the slider ground plane 122 is electrically connected to the base ground plane 120 at low frequencies (DC to kHz) but becomes open circuit in high frequencies (MHz to GHz). The use of an RF separated ground plane for the second antenna 118 reduces destructive current flows between the two antennas 116, 118 that may occur when they share a common ground plane. This may be advantageous for antennas 116, 118 that are intended for diversity applications, such as CDMA or Edge Evolution.

Figure 5:
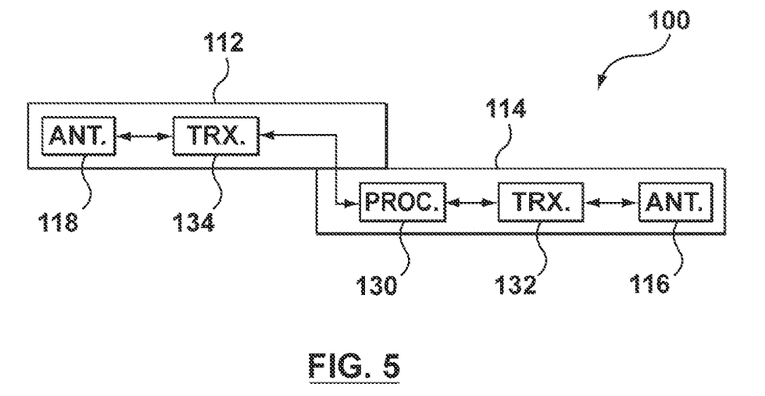
FIG. 5 diagrammatically shows a second example embodiment of the device.

Reference is now made to FIG. 5, which diagrammatically shows a second example embodiment of the device 100. FIG. 5 shows, in block diagram form, a processor 130 and a first transceiver 132 in the base portion 114. The processor 130 communications with and is configured to control the first transceiver 132. The first transceiver 132 receives RF level signals from the first antenna 116 when receiving signals and drives the first antenna 116 with RF level signals when transmitting. Among its functions, the first transceiver 132 demodulates the received RF level signals and modulates transmit signals. It will be understood that the device 100 includes many other components, including memory, I/O devices, etc., that communicate with and operate under the control of the processor 130.

The slider portion 112 includes a second transceiver 134 for receiving signals from the second antenna 118 and for driving the second antenna 118 with RF level signals during transmission. The second transceiver 134 operates under control of the processor 130. Accordingly, the processor 130 or related components (under control of the processor 130) within the base portion 114 provide the second transceiver 134 with a data signal or other information with which to modulate an RF level signal for transmission. Additionally, the second transceiver 134 provides a demodulated data signal to the processor 130 upon demodulating a received RF level signal. The communication of data or information signals between the second transceiver 134 and the processor 130 occurs over data path 136.

Data path 136 is a digital serial or parallel link (or combination of both) between the second transceiver 134 within the slider portion 112 and the processor 130 or related components within the base portion 114. In other words, the data path 136 provides for digital communications between base portion 114 and the slider portion 112. In one embodiment, the data path 136 includes a flex cable, such as flex cable 22 from FIGS. 2 and 3. In one example, additional signal lines are added to the flex cable 22 to provide for the data path 136 enabling communications between the second transceiver 134 and the processor 130. To reduce the number of signal lines necessary, the communications between the processor 130 and the transceiver 134 may, at least partly, be serial communications. In one example, the second antenna 118 and the second transceiver 134 are for GPS communications. The GPS communication protocol employs a serial link, meaning it requires fewer signal lines in the data path 136 than some other digital applications, such as the LCD display.

Figure 6:
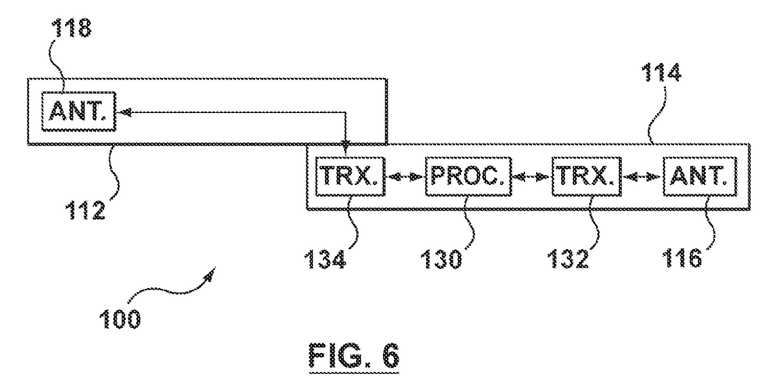
FIG. 6 diagrammatically shows a third example embodiment of the device.

Reference is now made to FIG. 6, which diagrammatically shows a third example embodiment of the device 100. In addition to having the processor 130 and the first transceiver 132 in the base portion 114, in this embodiment the second transceiver 134 is located in the base portion 114 instead of the slider portion 112. Accordingly, the device 100 includes an RF link 140 between the second antenna 118 and the second transceiver 134.

The RF link 140 carries RF level signals between the second antenna 118 in the slider portion 112 and the second transceiver 134 in the base portion 114. The RF link 140 may, in some embodiments, include a flex cable, a coaxial cable, or any other medium capable of propagating RF level signals between the base portion 114 and the slider portion 112 without significant degradation of the signal.

Given that the slider portion 112 is arranged to move relative to the base portion 114, the RF Link 140 is configured to accommodate this movement. For example, the RF link 140 may be implemented by way of flex cable, as illustrated in FIGS. 2 and 3; however, flex cable may be excessively lousy at radio frequencies for some implementations. The use of flex cable may result in interference and signal distortions that would materially degrade the RF signal quality.

Figure 7:
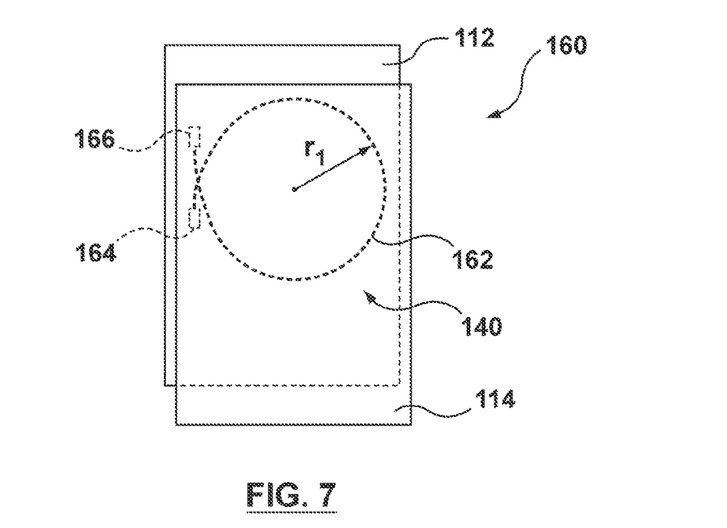
FIGS. 7 and 8 diagrammatically show an example slider-type mobile communications device in a closed position and in an extended position, respectively.
Figure 8:
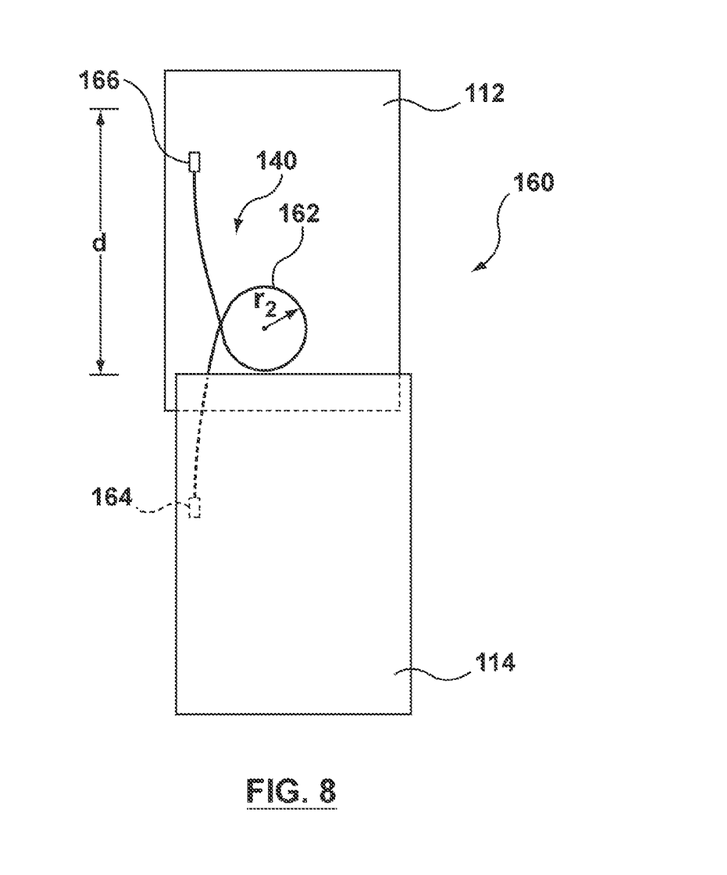

Coaxial cable may be used as the RF link 140 provided it is configured to permit movement of the slider portion 112 between its closed and extended positions. Reference is now made to FIGS. 7 and 8, which illustrate an example configuration of such a cable. FIG. 7 diagrammatically shows an example slider-type mobile communications device 160 in a closed position. FIG. 8 shows the device 160 in an extended position. The device 160 is shown in a transparent planar view with all internal components omitted except for the RF link 140. In this example, the RF link 140 is a cable 162, such as a coaxial cable.

The cable 162 has a first end 164 fixed in position with respect to the base portion 114. The first end 164 may be connected, for example, to an RF port of the second transceiver (not shown). The cable 162 also has a second end 166 fixed in position with respect to the slider portion 112. The second end 116 may be connected, for example, to an RF signal port of the second antenna (not illustrated). The cable 162 is physically positioned to be coiled or looped within the horizontal plane of the device 160. In other words, the cable 162 forms a loop within either the base portion 114 or the slider portion 112 casings. The loop, when the device 160 is in the closed position, is of radius $r_1$. In one embodiment the radius $r_1$ is approximately half the interior width of the device 160 casing so as to maximize the size of the loop. It will be understood that the cable 162 may, in some embodiments, have a minimum radius that must be maintained to ensure proper signal transmission. To form the loop, the cable 162 is arranged such that the first end 164 within the base portion 114 is fixed such that the cable 162 extends from the first end 164 towards the direction in which the slider portion 112 moves into the extended position. Similarly, the second end 166 within the slider portion 112 is fixed such that the cable 162 extends from the second end 166 away from the direction in which the slider portion 112 moves into the extended position.

Referring still to FIGS. 7 and 8, it will be noted that when the device 160 is in a closed position, the two ends 164, 166 are brought relatively close together. When the slider portion 112 is moved into the extended position, the second end 166 is drawn away from the first end 164, pulling the loop of the cable 162 smaller. When in the extended position, the loop has a radius $r_2$, which is smaller than the radius $r_1$. The distance that the slider portion 112 (and thus the second end 166) translates is shown as d in FIG. 8. This distance d and the length of cable 162 may be selected to ensure that the radius $r_2$ does not fall below a minimum radius for the cable 162.

Figure 13:
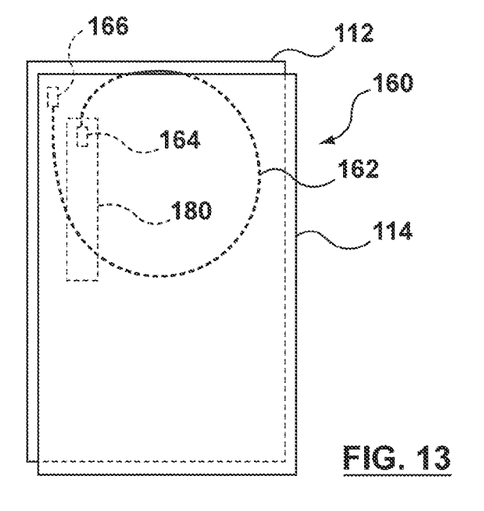
FIGS. 13 and 14 diagrammatically show a example slider-type mobile communications device in a closed position and in an extended position, respectively.
Figure 14:
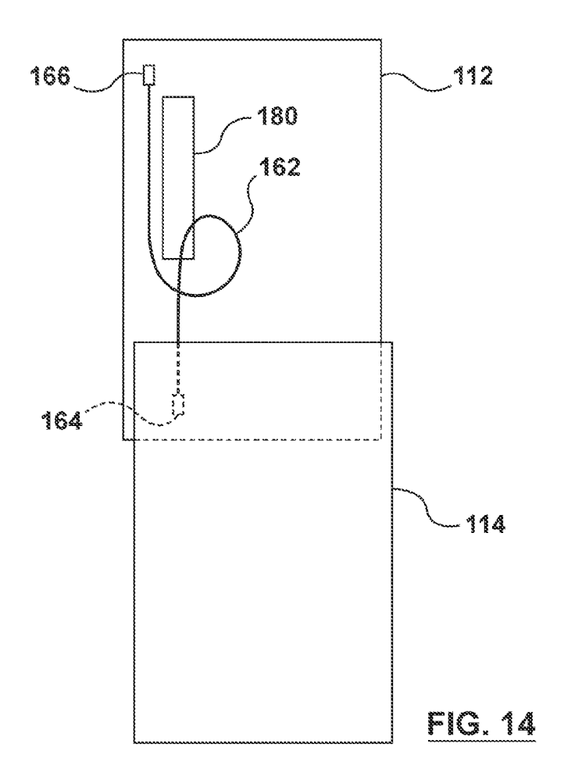

Reference is now made to FIGS. 13 and 14, which diagrammatically illustrate one example embodiment of the device 160. FIG. 13 illustrates the device 160 in a closed position, while FIG. 14 illustrates the device 160 in an open position. In this embodiment, the slider portion 112 includes a slot 180 in its casing between the slider portion 112 and the base portion 114. The slot 180 is arranged longitudinally with respect to the direction of translation of the slider portion 112. This allows the cable 162 freedom of movement in the longitudinal direction when its coil is tightening or loosening with movement of the slider portion 112.

In this embodiment, the second end 164 is attached to the slider portion 112 near, but just off axis from the slot 180. The first end 166 is attached to the base portion 114 near or along the axis of the slot 180. When in a closed position, as shown in FIG. 13, the ends 164, 166 are brought close together, and the cable 162 is coiled with a large radius. It will be noted that the cable 162 is coiled substantially within the slider portion 112. Accordingly, the slider portion 112 in this embodiment includes a cavity or spacing within its casing, likely behind its display screen, for accommodating the cable 162.

As the slider portion 112 is moved into the open position, as shown in FIG. 14, the ends 164, 166 of the cable 162 are drawn apart, causing the coil to tighten. The slot 180 allows the cable 162 the flexibility to coil in such a manner that it maintains as large a radius as possible.

In this embodiment, the slot 180 is formed in a wall of the casing of the slider portion 112 facing the base portion 114. In another embodiment, the slot 180 may be formed in that portion of the casing or housing of the base portion 114 that faces the slider portion 112.

It will be appreciated that the slider portion 112 and base portion 114 of the device 160 have separate housing or casings connected together by a slider mechanism. The housing or casing of each of the portions is generally "flat", meaning it is relatively thin compared with its x- and y-dimensions, wherein the x- and y-dimensions are the dimensions illustrated in FIGS. 7, 8, 13, and 14. The x- and y-dimensions may be referred to as the "horizontal plane" of the device or housing or casing. The cable 162 lies generally flat in the horizontal plane within the casings. In other words, it is coiled in the horizontal plane within the casings, and is afforded room within at least one of the casings to draw into a tighter (smaller radius) coil as the casings are slid apart (as illustrated in FIGS. 8 and 14).

Figure 9:
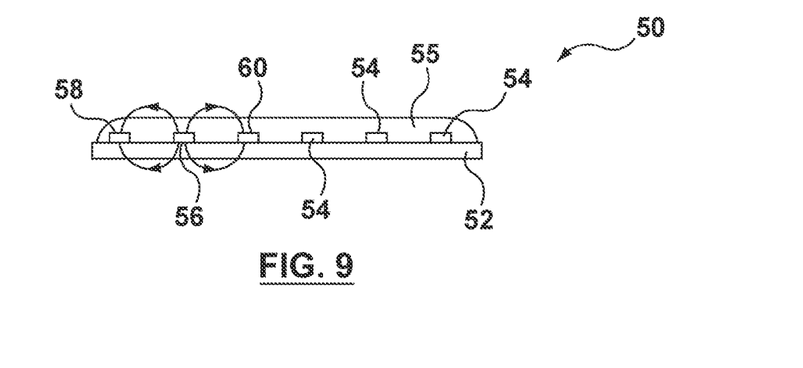
FIG. 9 shows a cross-sectional view of a typical flex cable.

Reference is now made to FIG. 9, which shows a cross-sectional view of a typical flex cable 50. The flex cable 50 is manufactured by providing a relatively thin flexible substrate 52 and depositing conductive material, such as copper, lengthwise along the substrate to form signal lines 54. A laminate 55 is then applied atop the signal lines 54.

If used for carrying RF signals, the flex cable 50 tends to be fairly lousy. For example, an RF signal carried by one of the signal lines 56 will radiate an electromagentic wave that will couple with adjacent signal lines 58, 60. Attenuation and interference may seriously degrade the quality of the RF signal.

Figure 10:
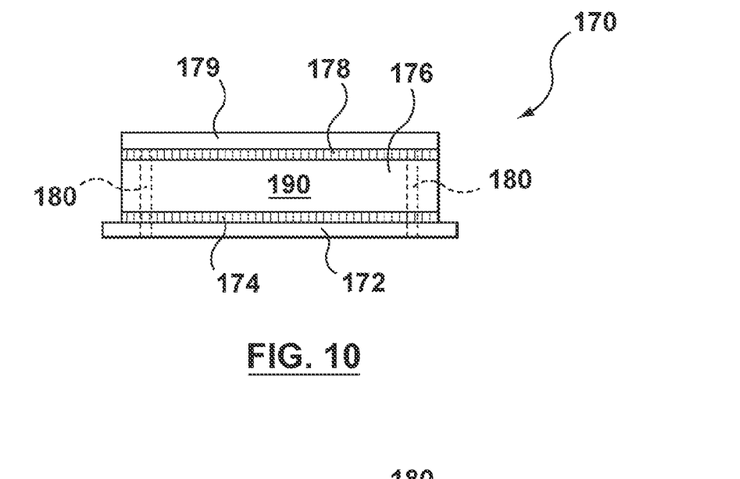
FIG. 10 shows a cross-sectional view of an RF-capable flex cable.
Figure 11:
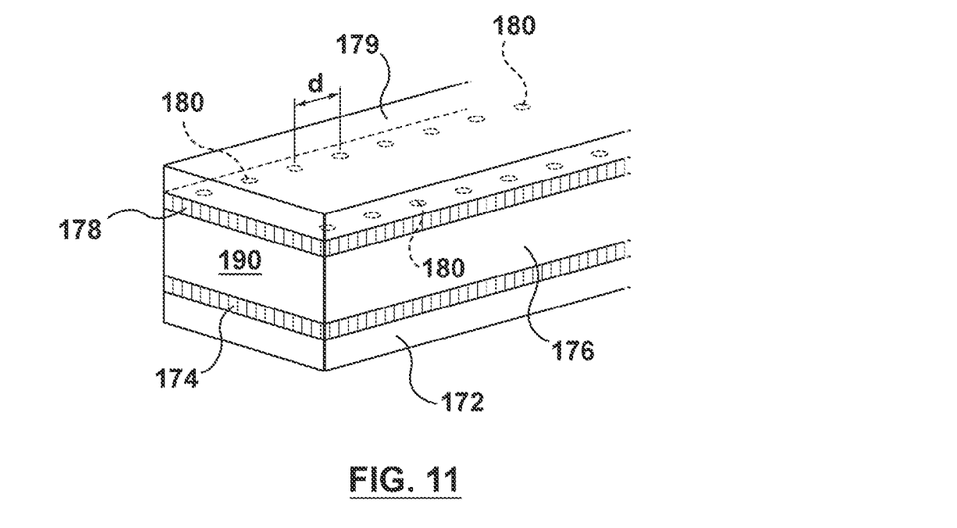
FIG. 11 shows a perspective view of the RF-capable flex cable cable.

FIGS. 10 and 11 show an example embodiment of a RF-capable flex cable 170 that may be used to carry RF signals between the slider portion and base portion of a slider phone, or indeed to carry RF signals between any two points in an electronic device.

FIG. 11 shows a perspective view of the RF-capable flex cable cable 170 and FIG. 10 shows a cross-sectional view of the RF-capable flex cable 170. The cable 170, in this example embodiment, is formed from a flexible substrate 172 layer, upon which is deposited a first or bottom flexible conductive metal layer 174. The bottom layer 174 may be formed, for example, from copper or other suitable metal. An intermediate substrate layer 176 is placed atop the bottom metal layer 174. The intermediate substrate layer 176 is formed from a suitable dielectric material. For example, in one embodiment the dielectric material may be polyimide. A second or top flexible conductive metal layer 178 is deposited atop the intermediate substrate layer 176. A further laminate layer 179 may, in some embodiments, be applied atop the top metal layer 178.

In practice, substrate may often be obtained with a copper layer already attached to a dielectric (e.g. polyimide) material. A pattern may be etched into the copper layer, for example if making multiple flex cables in parallel. Subsequent dielectric layers or metallic layers may be bonded, a layer at a time, to the substrate material. Vias are then formed by drilling holes into the assembled layers and electroplating the vertical walls of the holes. A protective laminate may then be deposited on top or bottom of the assembled layers forming the flex cable. If shielding is required, a conductive laminate may be used instead of a dielectric laminate. Those skilled in the art will appreciate the range of manufacturing techniques that may be employed depending upon the specific materials being used for each layer of the flex cable.

The layered cable shown in FIGS. 10 and 11 includes two strips of conductive material, 174, 178, with a dielectric layer 176 between them. The conductive metal layers 174, 178 are then interconnected by two rows of vias 180 running the length of the flex cable 170. The two rows of vias 180 are placed down either longitudinal side of the two conductive layers 174, 178, to enclose an approximately rectangular dielectric-filled space 190. The vias 180 in each row are spaced sufficiently closely adjacent to each other (e.g. distance d) so as to appear as a solid wall to an RF signal having a particular wavelength. In one embodiment, the spacing between adjacent vias 180 is less than $\frac{1}{10}^{th}$ of the operating wavelength. Practically, from a manufacturing point of view, there is little or no additional cost associated with adding more vias, so the limitation on the number of closely spaced vias is the mechanical integrity of the flex cable 170.

The space 190 surrounded by the conductive layers 174, 178, and vias 180 acts as a rectangular waveguide for a propagating wave. Thus the cable 170 is capable of carrying electromagnetic waves having particular properties, such as a wavelength within certain ranges dependent upon the dimensions of the cable 170 cross section, without significant energy loss to the ambient surrounding as compared to conventional flex cable.

Those skilled in the art will appreciate that the flex cable 170 may be operative connected to components for transmitting RF waves using a low profile coaxial connector. One example of such a connector is a Hirose™ FL-series low profile coaxial connector. Other types or brands of suitable connectors will be understood by those ordinarily skilled in the art having regard to the description herein.

Provided the substrate 172, conductive layers 174, 178, dielectric 180, and any laminates 179 are sufficiently flexible and thin, then the cable 170 may be used to carry RF signals in slider phones and other applications in which the cable 170 needs to flex, bend or curve.

Figure 19:
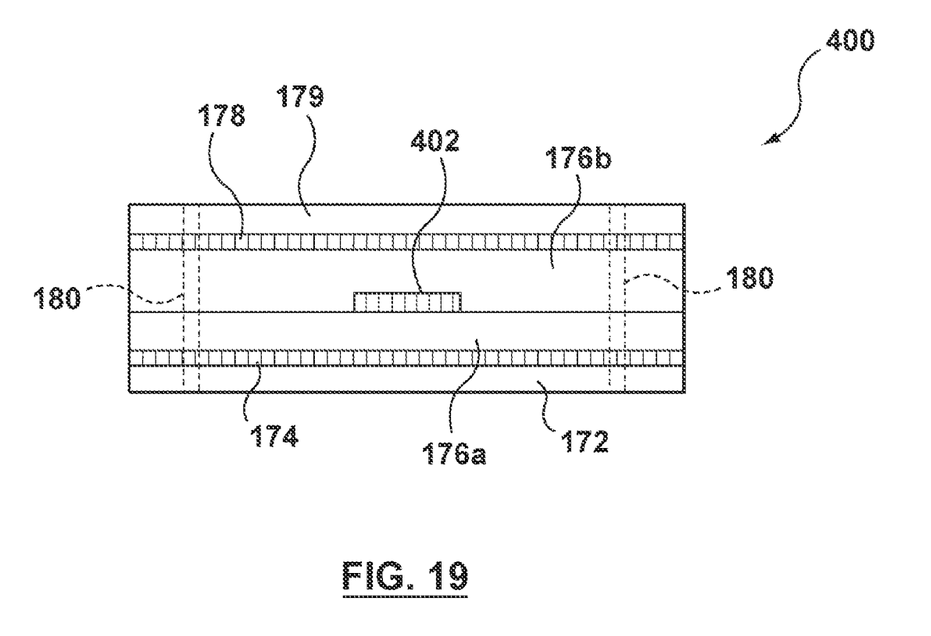
FIG. 19 shows a cross-sectional view of another example of an RF-capable flex cable.

Yet a further embodiment is illustrated in FIG. 19. FIG. 19 shows a cross-sectional view of another example RF-capable flex cable 400. This example RF-capable flex cable 400 includes a thin stripline 402 within the dielectric layer 176 (shown as 176a, 176b). The stripline 402 is created by constructing the dielectric layer 176 in two parts: first, using a thin bottom dielectric layer 176a the strip line 402 is deposited atop the bottom dielectric layer 176a. Then a top dielectric layer 176b is applied to cover the stripline 402.

The stripline 402 plays a role somewhat similar to the center conductor of a coaxial cable. It serves to transport RF signals within the range of 1 MHz to 3 GHz.

Reference is now made to FIGS. 15 through 18 which illustrate example embodiments of an assembly 300 of layered materials for forming a flex cable in accordance with the present application. Beginning with FIG. 15, the assembly 300 in this embodiment includes a base laminate 302. The base laminate is a dielectric layer 304 with an upper metal layer 306 and a lower metal layer 308 deposited on either side. The dielectric layer 304 may be manufactured from any suitable dielectric material having appropriate electromagnetic and material strength properties. In one embodiment, the dielectric layer 304 is formed using polyimide. The upper and lower metal layers 306, 308 are then deposited upon the dielectric layer 304. The base laminate 302 may be obtained as a single product layer from a suitable manufacturer. For example, the base laminate 302 may be formed using Dupont™ product no. AK-125012EM.

Figure 15:
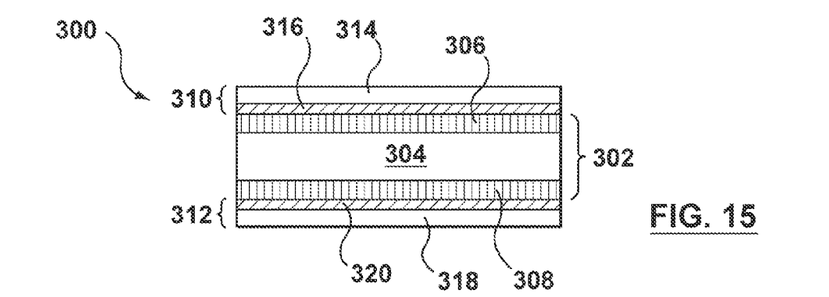
FIGS. 15 through 18 show cross-sections of example assemblies of layers for constructing a flex cable in accordance with the present application.

An upper coverlay 310 and a lower coverlay 312 are then applied to the upper and lower surfaces of the base laminate 302. The upper coverlay 310 includes an adhesive layer 316 and a protective upper dielectric layer 314. Similarly, the lower coverlay 312 includes an adhesive layer 320 and a protective lower dielectric layer 318. The dielectric layers 314, 318 may be polyimide in some example embodiments. For example, the upper and lower coverlays 310, 312 may be formed using Arisawa™ product no. CJA0525KA.

Figure 16:
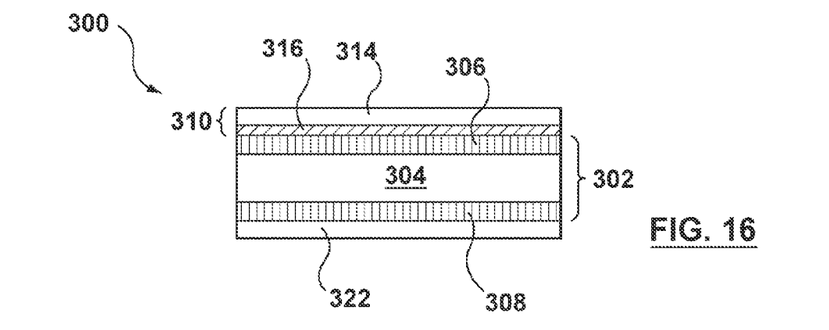

Referring now to FIG. 16, it will be noted that the assembly 300 in this embodiment excludes the lower coverlay 312. Instead, in its place is a lower shielding film 322 applied to the outer surface of the lower metal layer 308. The lower shielding film 322 may include internal layers including adhesion layer(s), an anisotropic conductive adhesion layer, a metallic layer, insulation layer(s), etc. An example lower shielding film 322 is SF-PC5500 manufactured and sold by Tatsuta System Electronics Co., Ltd. The lower shielding film 322 may assist in preventing electromagnetic interference.

Figure 17:
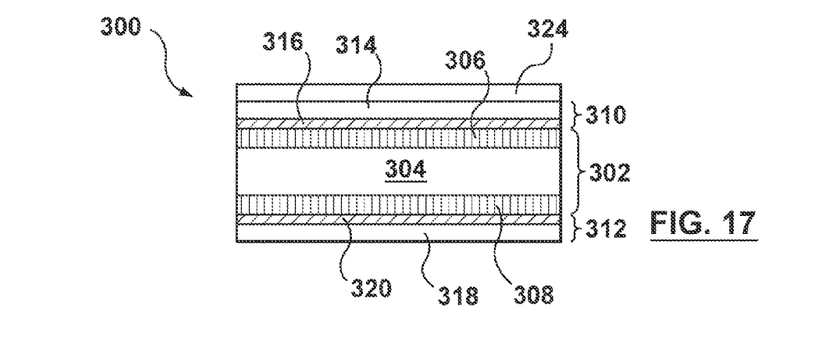

In another embodiment, illustrated in FIG. 17, an upper shielding film 324 may be applied atop the upper coverlay 310. The upper shielding film 324 may be designed to prevent electromagnetic interference.

Figure 18:
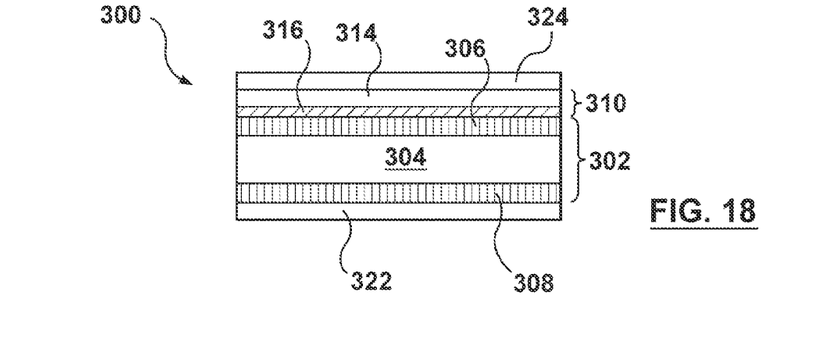

In yet another embodiment, illustrated in FIG. 18, the assembly 300 may exclude the lower coverlay 312 but may include both the upper shielding film 324 and lower shielding film 322.

Other variations and modifications in the layers included in the assembly 300 will be appreciated by those ordinarily skilled in the art having regard to the description herein.

It will also be appreciated that the metal layers 306, 308 may be solid metal layers. Alternatively, either or both of the metal layers 306, 308 may be etched with a pattern. The etching of the metal layers 306, 308 may introduce a patterned removal of the metal intended to increase the flexibility of the layers 306, 308 without compromising their ability to act as an effective metal surface for containing wave propagation within the dielectric layer 304. In one example, the metal layers 306, 308 may be etched to create a cross-hatch pattern, with small diamonds or squares etched out of the metal. Other etching patterns may be used.

It will also be appreciated that the assembly 300 is used to form the flex cable 170 of FIGS. 10 and 11 by forming vias joining the upper and lower metal layers 306, 308. In some instances, the vias may be formed in the base laminate 302 before application of the other layers of the assembly 300. In other instances the vias may be formed after the assembly 300 has be fully assembled.

Referring again to FIG. 19, in one example implementation the bottom dielectric layer 176a may be a polyimide and the stripline 402 may be constructed with copper. In one example, the bottom dielectric layer 176a and stripline 402 may be obtained as a single product layer from a suitable manufacturer such as Dupont™ product no. AP 7163E. Other suitable construction materials and processes will be appreciated by those of ordinary skill in the art in view of the description herein.

Figure 12:
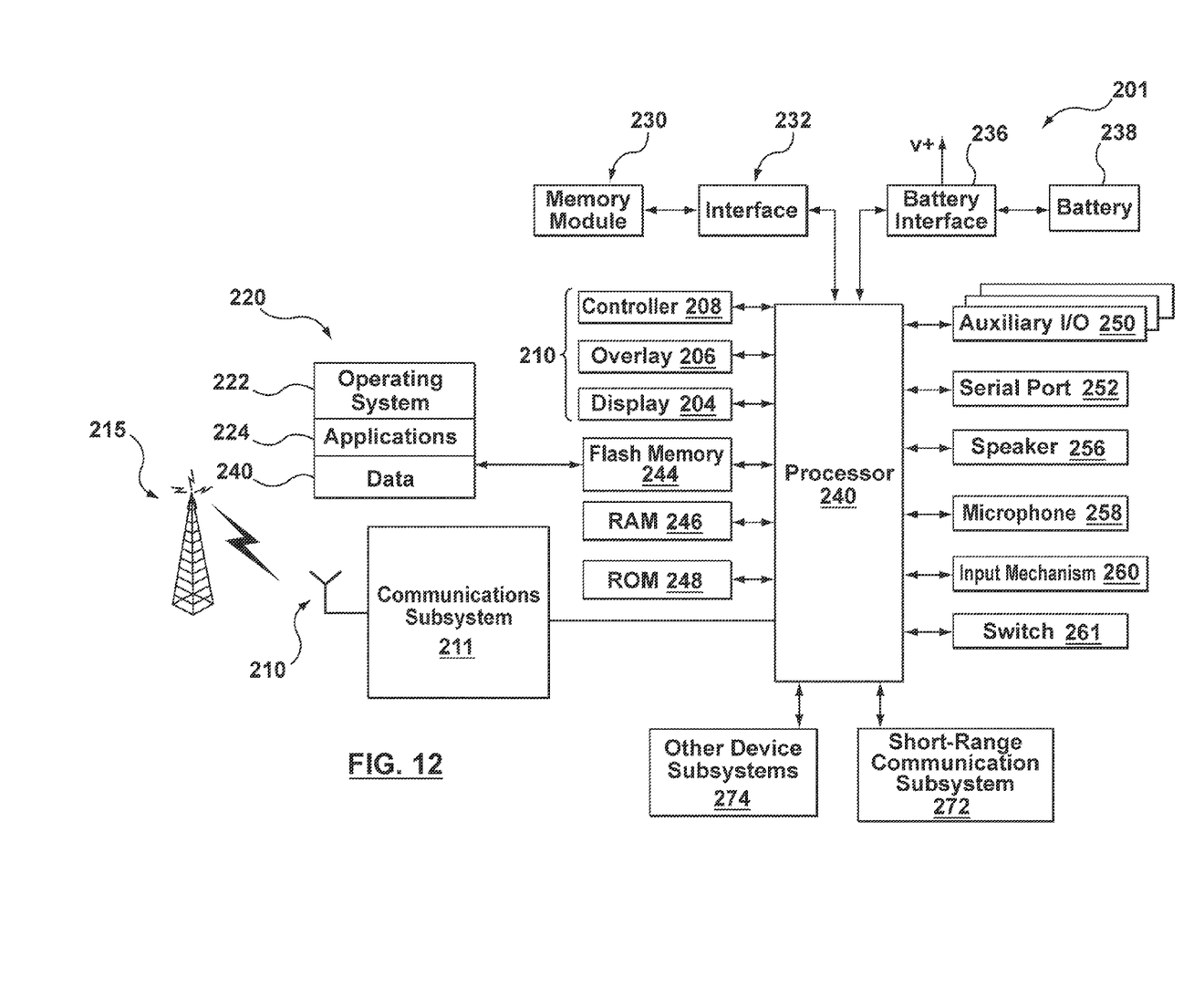
FIG. 12 shows a block diagram of an example embodiment of a mobile communication device.

Reference is now made to FIG. 12, which shows an example embodiment of a mobile communication device 201 which may incorporate multiple RF antennas, as described above. The mobile communication device 201 is a two-way communication device having voice and possibly data communication capabilities; for example, the capability to communicate with other computer systems, e.g., via the Internet. Depending on the functionality provided by the mobile communication device 201, in various embodiments the device may be a multiple-mode communication device configured for both data and voice communication, a smartphone, a mobile telephone or a PDA (personal digital assistant) enabled for wireless communication, or a computer system with a wireless modem.

The mobile communication device 201 includes a controller comprising at least one processor 240 such as a microprocessor which controls the overall operation of the mobile communication device 201, and a wireless communication subsystem 211 for exchanging radio frequency signals with the wireless network 215. The processor 240 interacts with the communication subsystem 211 which performs communication functions. The processor 240 interacts with additional device subsystems. In some embodiments, the device 201 may include a touchscreen display 210 which includes a display (screen) 204, such as a liquid crystal display (LCD) screen, with a touch-sensitive input surface or overlay 206 connected to an electronic controller 208. The touch-sensitive overlay 206 and the electronic controller 208 provide a touch-sensitive input device and the processor 240 interacts with the touch-sensitive overlay 206 via the electronic controller 208. In other embodiments, the display 204 may not be a touchscreen display. Instead, the device 201 may simply include a non-touch display and one or more input mechanisms, such as, for example, a depressible scroll wheel.

The processor 240 interacts with additional device subsystems including flash memory 244, random access memory (RAM) 246, read only memory (ROM) 248, auxiliary input/output (I/O) subsystems 250, data port 252 such as serial data port, such as a Universal Serial Bus (USB) data port, speaker 256, microphone 258, input mechanism 260, switch 261, short-range communication subsystem 272, and other device subsystems generally designated as 274. Some of the subsystems shown in FIG. 12 perform communication-related functions, whereas other subsystems may provide "resident" or on-device functions.

The communication subsystem 211 may include a receiver, a transmitter, and associated components, such as one or more antenna elements 210, local oscillators (LOs), and a processing module such as a digital signal processor (DSP). The antenna 210 may be embedded or internal to the mobile communication device 201 and a single antenna may be shared by both receiver and transmitter, as is known in the art. As will be apparent to those skilled in the field of communication, the particular design of the communication subsystem 211 depends on the wireless network 215 in which the mobile communication device 201 is intended to operate. As described above, the antenna 210 may include multiple RF antennas, at least one of which is located in a second portion of the device 201, such as a slider portion.

The mobile communication device 201 may communicate with any one of a plurality of fixed transceiver base stations of a wireless network 215 within its geographic coverage area. The mobile communication device 201 may send and receive communication signals over the wireless network 215 after a network registration or activation procedures have been completed. Signals received by the antenna 210 through the wireless network 215 are input to the receiver, which may perform such common receiver functions as signal amplification, frequency down conversion, filtering, channel selection, etc., as well as analog-to-digital (A/D) conversion. A/D conversion of a received signal allows more complex communication functions such as demodulation and decoding to be performed in the DSP. In a similar manner, signals to be transmitted are processed, including modulation and encoding, for example, by the DSP. These DSP-processed signals are input to the transmitter for digital-to-analog (D/A) conversion, frequency up conversion, filtering, amplification, and transmission to the wireless network 215 via the antenna 210.

The processor 240 operates under stored program control and executes software modules 220 stored in memory such as persistent memory, for example, in the flash memory 244. As illustrated in FIG. 12, the software modules 220 comprise operating system software 222 and software applications 224.

Those skilled in the art will appreciate that the software modules 220 or parts thereof may be temporarily loaded into volatile memory such as the RAM 246. The RAM 246 is used for storing runtime data variables and other types of data or information, as will be apparent to those skilled in the art. Although specific functions are described for various types of memory, this is merely one example, and those skilled in the art will appreciate that a different assignment of functions to types of memory could also be used.

The software applications 224 may include a range of other applications, including, for example, a messaging application, a calendar application, and/or a notepad application. In some embodiments, the software applications 224 include an email message application, a push content viewing application, a voice communication (i.e. telephony) application, a map application, and a media player application. Each of the software applications 224 may include layout information defining the placement of particular fields and graphic elements (e.g. text fields, input fields, icons, etc.) in the user interface (i.e. the display device 204) according to the application.

In some embodiments, the auxiliary input/output (I/O) subsystems 250 may comprise an external communication link or interface, for example, an Ethernet connection. The mobile communication device 201 may comprise other wireless communication interfaces for communicating with other types of wireless networks, for example, a wireless network such as an orthogonal frequency division multiplexed (OFDM) network or a GPS transceiver for communicating with a GPS satellite network (not shown). The auxiliary I/O subsystems 250 may comprise a vibrator for providing vibratory notifications in response to various events on the mobile communication device 201 such as receipt of an electronic communication or incoming phone call, or for other purposes such as haptic feedback (touch feedback).

In some embodiments, the mobile communication device 201 also includes a removable memory card 230 (typically comprising flash memory) and a memory card interface 232. Network access may be associated with a subscriber or user of the mobile communication device 201 via the memory card 230, which may be a Subscriber Identity Module (SIM) card for use in a GSM network or other type of memory card for use in the relevant wireless network type. The memory card 230 is inserted in or connected to the memory card interface 232 of the mobile communication device 201 in order to operate in conjunction with the wireless network 215.

The mobile communication device 201 stores data 240 in an erasable persistent memory, which in one example embodiment is the flash memory 244. In various embodiments, the data 240 includes service data comprising information required by the mobile communication device 201 to establish and maintain communication with the wireless network 215. The data 240 may also include user application data such as email messages, address book and contact information, calendar and schedule information, notepad documents, image files, and other commonly stored user information stored on the mobile communication device 201 by its user, and other data. The data 240 stored in the persistent memory (e.g. flash memory 244) of the mobile communication device 201 may be organized, at least partially, into a number of databases each containing data items of the same data type or associated with the same application.

The serial data port 252 may be used for synchronization with a user's host computer system (not shown). The serial data port 252 enables a user to set preferences through an external device or software application and extends the capabilities of the mobile communication device 201 by providing for information or software downloads to the mobile communication device 201 other than through the wireless network 215. The alternate download path may, for example, be used to load an encryption key onto the mobile communication device 201 through a direct, reliable and trusted connection to thereby provide secure device communication.

In some embodiments, the mobile communication device 201 is provided with a service routing application programming interface (API) which provides an application with the ability to route traffic through a serial data (i.e., USB) or Bluetooth® (Bluetooth® is a registered trademark of Bluetooth SIG, Inc.) connection to the host computer system using standard connectivity protocols. When a user connects their mobile communication device 201 to the host computer system via a USB cable or Bluetooth® connection, traffic that was destined for the wireless network 215 is automatically routed to the mobile communication device 201 using the USB cable or Bluetooth® connection. Similarly, any traffic destined for the wireless network 215 is automatically sent over the USB cable Bluetooth® connection to the host computer system for processing.

The mobile communication device 201 also includes a battery 238 as a power source, which is typically one or more rechargeable batteries that may be charged, for example, through charging circuitry coupled to a battery interface such as the serial data port 252. The battery 238 provides electrical power to at least some of the electrical circuitry in the mobile communication device 201, and the battery interface 236 provides a mechanical and electrical connection for the battery 238. The battery interface 236 is coupled to a regulator (not shown) which provides power V+ to the circuitry of the mobile communication device 201.

The short-range communication subsystem 272 is an additional optional component which provides for communication between the mobile communication device 201 and different systems or devices, which need not necessarily be similar devices. For example, the subsystem 272 may include an infrared device and associated circuits and components, or a wireless bus protocol compliant communication mechanism such as a Bluetooth® communication module to provide for communication with similarly-enabled systems and devices.

A predetermined set of applications that control basic device operations, including data and possibly voice communication applications will normally be installed on the mobile communication device 201 during or after manufacture. Additional applications and/or upgrades to the operating system 221 or software applications 224 may also be loaded onto the mobile communication device 201 through the wireless network 215, the auxiliary I/O subsystem 250, the serial port 252, the short-range communication subsystem 272, or other suitable subsystem 274 other wireless communication interfaces. The downloaded programs or code modules may be permanently installed, for example, written into the program memory (i.e. the flash memory 244), or written into and executed from the RAM 246 for execution by the processor 240 at runtime. Such flexibility in application installation increases the functionality of the mobile communication device 201 and may provide enhanced on-device functions, communication-related functions, or both. For example, secure communication applications may enable electronic commerce functions and other such financial transactions to be performed using the mobile communication device 201.

The wireless network 215 may comprise one or more of a Wireless Wide Area Network (WWAN) and a Wireless Local Area Network (WLAN) or other suitable network arrangements. In some embodiments, the mobile communication device 201 is configured to communicate over both the WWAN and WLAN, and to roam between these networks. In some embodiments, the wireless network 215 may comprise multiple WWANs and WLANs. In some embodiments, the mobile device 201 includes the communication subsystem 211 for WWAN communications and a separate communication subsystem for WLAN communications. In most embodiments, communications with the WLAN employ a different antenna than communications with the WWAN. Accordingly, the antenna 210 may be configured for WWAN communications or WLAN communications depending on the embodiment and desired application.

In some embodiments, the WWAN conforms to one or more of the following wireless network types: Mobitex Radio Network, DataTAC, GSM (Global System for Mobile Communication), GPRS (General Packet Radio System), TDMA (Time Division Multiple Access), CDMA (Code Division Multiple Access), CDPD (Cellular Digital Packet Data), iDEN (integrated Digital Enhanced Network), EvDO (Evolution-Data Optimized) CDMA2000, EDGE (Enhanced Data rates for GSM Evolution), UMTS (Universal Mobile Telecommunication Systems), HSPDA (High-Speed Downlink Packet Access), IEEE 802.16e (also referred to as Worldwide Interoperability for Microwave Access or "WiMAX"), or various other networks. Although WWAN is described as a "Wide-Area" network, that term is intended herein also to incorporate wireless Metropolitan Area Networks (WMAN) and other similar technologies for providing coordinated service wirelessly over an area larger than that covered by typical WLANs.

The WLAN comprises a wireless network which, in some embodiments, conforms to IEEE 802.11x standards (sometimes referred to as Wi-Fi) such as, for example, the IEEE 802.11a, 802.11b and/or 802.11 g standard. Other communication protocols may be used for the WLAN in other embodiments such as, for example, IEEE 802.11n, IEEE 802.16e (also referred to as Worldwide Interoperability for Microwave Access or "WiMAX"), or IEEE 802.20 (also referred to as Mobile Wireless Broadband Access). The WLAN includes one or more wireless RF Access Points (AP) that collectively provide a WLAN coverage area.

In one aspect, the present application discloses a mobile communication device. The device includes a base portion and a parallel slider portion connected through a slide assembly; a transceiver housed in one of the base portion and the slider portion; an RF antenna housed in the other of the base portion and the slider portion; and a coiled cable having one end connected to the RF antenna and having its other end connected to the transceiver.

In another aspect, the present application discloses a mobile communication device. The device includes a base portion and a parallel slider portion connected through a slide assembly; a transceiver housed in one of the base portion and the slider portion; an RF antenna housed in the other of the base portion and the slider portion; and a coiled coaxial cable connecting the RF antenna to the transceiver, wherein the coiled coaxial cable is arranged in a loop, and the loop is disposed within one of the base portion and the slider portion.

In one aspect, the present application discloses a mobile communication device. The device includes a base portion and a parallel slider portion connected through a slide assembly; a transceiver housed in one of the base portion and the slider portion; an RF antenna housed in the other of the base portion and the slider portion; and an RF-capable flex cable having one end connected to the RF antenna and having its other end connected to the transceiver.

In another aspect, the present application discloses a mobile communication device. The device includes a first part containing first electrical circuitry; a second part containing second electrical circuitry; and an RF-capable flex cable having one end connected to the first electrical circuitry and its other end connected to the second electrical circuitry for communicating RF signals.

Although the foregoing detailed description includes many references to mobile phones and two-piece phones in particular, the present application is not specifically limited to mobile phones or to handheld communication devices in general. The present application is directed to flexible cable and methods of manufacturing flexible cable. The use of the flexible cable for transporting RF signals within mobile communication devices is but one example use for such cable. The present application encompasses the use of such cable in other devices or equipment for transporting RF signals for any purpose.

Certain adaptations and modifications of the described embodiments can be made. Therefore, the above discussed embodiments are considered to be illustrative and not restrictive.

What is claimed is:

1. A flexible cable for communicating RF signals, the cable comprising:
    an elongate base substrate including:
        a dielectric layer;

an upper metal layer deposited on an upper side of the dielectric layer; and a lower metal layer deposited on a lower side of the dielectric layer; and two parallel spaced-apart series of vias formed along the length of the base substrate, wherein the vias in each series are closely spaced adjacent to one another, each via electrically interconnecting the upper metal layer and the lower metal layer, whereby a rectangular cross-sectional waveguide is formed and bounded by the upper metal layer, the lower metal layer and the two series of vias.

2. The flexible cable claimed in claim 1, further including a stripline conductor running the length of the base substrate within the dielectric layer between the upper metal layer and the lower metal layer, and between the two series of vias.

3. The flexible cable claimed in claim 1, wherein at least one of the upper metal layer and lower metal layer is etched to remove metal.

4. The flexible cable claimed in claim 3, wherein said at least one metal layer has a mesh pattern due to the etched removal of metal.

5. The flexible cable claimed in claim 1, further including a cover layer atop one of the upper metal layer and the lower metal layer, wherein the cover layer comprises an outer dielectric layer and an adhesive layer bonding said outer dielectric layer to said one of the metal layers.

6. The flexible cable claimed in claim 5, further including a shielding film applied atop the cover layer.

7. The flexible cable claimed in claim 1, further including a shielding film applied atop one of the upper metal layer and the lower metal layer.

8. The flexible cable claimed in claim 7, wherein the shielding film comprises an adhesive, a metallic layer, and an insulation layer.

9. The flexible cable claimed in claim 1, wherein the dielectric layer comprises polyimide.

10. The flexible cable claimed in claim 1, wherein the upper metal layer and lower metal layer comprise copper layers.

11. A method of manufacturing a flexible cable, the method comprising:

providing an elongate base substrate including:
a dielectric layer;
an upper metal layer deposited on an upper side of the dielectric layer; and
a lower metal layer deposited on a lower side of the dielectric layer; and forming two parallel spaced-apart series of vias along the length of the base substrate, wherein the vias in each series are closely spaced adjacent to one another, each via electrically interconnecting the upper metal layer and the lower metal layer, whereby a rectangular cross-sectional waveguide is formed and bounded by the upper metal layer, the lower metal layer and the two series of vias.

12. The method claimed in claim 11, further including etching at least one of the upper metal layer and lower metal layer to remove metal.

13. The method claimed in claim 12, wherein said etching includes removing a pattern of metal to create a mesh.

14. The method claimed in claim 11, further including applying a cover layer atop one of the upper metal layer and the lower metal layer, wherein the cover layer comprises an outer dielectric layer and an adhesive layer bonding said outer dielectric layer to said one of the metal layers.

15. The method claimed in claim 14, further including applying a shielding film atop the cover layer.

16. The method claimed in claim 11, further including applying a shielding film atop one of the upper metal layer and the lower metal layer.

17. The method claimed in claim 16, wherein the shielding film comprises an adhesive, a metallic layer, and an insulation layer.

18. The method claimed in claim 11, wherein the dielectric layer comprises polyimide.

19. The method claimed in claim 11, wherein the upper metal layer and lower metal layer comprise copper layers.

* * * * *